(12) United States Patent
Ishida

(10) Patent No.: US 6,653,663 B2
(45) Date of Patent: Nov. 25, 2003

(54) NITRIDE SEMICONDUCTOR DEVICE

(75) Inventor: Masahiro Ishida, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/729,424

(22) Filed: Dec. 5, 2000

(65) Prior Publication Data

US 2001/0030328 A1 Oct. 18, 2001

(30) Foreign Application Priority Data

Dec. 6, 1999 (JP) .......................... 11-345806

(51) Int. Cl.[7] .................. H01L 27/15; H01L 33/00; H01L 31/036
(52) U.S. Cl. .................. 257/103; 257/87; 257/98; 257/103; 257/625; 257/626; 257/627; 257/628; 257/629; 257/630; 257/631
(58) Field of Search ................ 257/625–631, 257/87, 98, 103; 372/46

(56) References Cited

U.S. PATENT DOCUMENTS

| | | | | |
|---|---|---|---|---|
| 5,587,593 A | * | 12/1996 | Koide et al. .................. 257/94 |
| 5,864,171 A | * | 1/1999 | Yamamoto et al. ......... 257/628 |
| 6,265,089 B1 | * | 7/2001 | Fatemi et al. ............... 428/698 |
| 6,278,173 B1 | * | 8/2001 | Kobayashi et al. ......... 257/627 |

FOREIGN PATENT DOCUMENTS

| | | |
|---|---|---|
| JP | 08153931 | 6/1996 |
| JP | 09129974 | 5/1997 |
| JP | 10190059 | 7/1998 |

* cited by examiner

Primary Examiner—Eddie Lee
Assistant Examiner—Joseph Nguyen
(74) Attorney, Agent, or Firm—Nixon Peabody LLP; Donald R. Studebaker

(57) ABSTRACT

The nitride semiconductor device includes: a substrate made of a III–V group compound semiconductor containing nitride; and a function region made of a III–V group compound semiconductor layer containing nitride formed on a main surface of the substrate. The main surface of the substrate is tilted from a {0001} plane by an angle in a range of 13° to 90° inclusive.

8 Claims, 13 Drawing Sheets

FIG. 2

| TILT ANGLE θ | PERSPECTIVE VIEW OF DEVICE | PLAN VIEW OF DEVICE |
|---|---|---|
| θ = 90° | {1-100} SURFACE, {0001} SURFACE, {11-20} SURFACE | {0001} SURFACE, STRIPE REGION, {11-20} SURFACE |
| 45° ≤ θ ≤ 90° | {11-20} SURFACE, {0001} SURFACE | {0001} SURFACE, STRIPE REGION, {11-20} SURFACE |
| 28.1° ≤ θ < 45° | {11-20} SURFACE, {1-101} SURFACE | {1-101} SURFACE, STRIPE REGION, {11-20} SURFACE |
| θ = 28.1° | {0001} 28.1° OFF SURFACE, {11-20} SURFACE, {1-101} SURFACE | {1-101} SURFACE, STRIPE REGION, {11-20} SURFACE |
| 13° ≤ θ < 28.1° | {11-20} SURFACE, {1-101} SURFACE | {1-101} SURFACE, STRIPE REGION, {11-20} SURFACE |
| 0° < θ < 13° | {11-20} SURFACE, {1-100} SURFACE | {1-100} SURFACE, STRIPE REGION, {11-20} SURFACE |
| θ = 0° | {0001} SURFACE, {11-20} SURFACE, {1-100} SURFACE | {1-100} SURFACE, STRIPE REGION, {11-20} SURFACE |

FIG. 3

| TILT ANGLE θ | PERSPECTIVE VIEW OF DEVICE | PLAN VIEW OF DEVICE |
|---|---|---|
| θ =90° | {1-100} SURFACE<br>{11-20} SURFACE — {0001} SURFACE | {0001} SURFACE<br>STRIPE REGION<br>{11-20} SURFACE |
| θ =28.1° | {0001} 28.1° OFF SURFACE<br>{11-20} SURFACE — {1-101} SURFACE | {1-101} SURFACE<br>STRIPE REGION<br>{11-20} SURFACE |

FIG. 5
| TILT ANGLE FROM {0001} SURFACE θ | PERSPECTIVE VIEW OF DEVICE | PLAN VIEW OF DEVICE |
|---|---|---|
| θ = 90° | 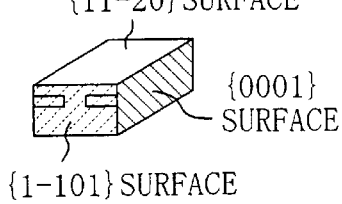 {11-20} SURFACE, {0001} SURFACE, {1-101} SURFACE | 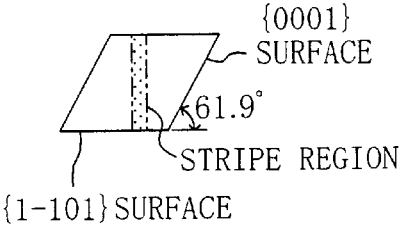 {0001} SURFACE, 61.9°, STRIPE REGION, {1-101} SURFACE |
| 45° ≤ θ < 90° | 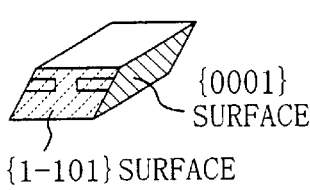 {0001} SURFACE, {1-101} SURFACE | 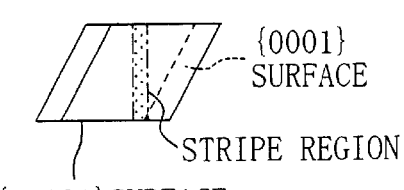 {0001} SURFACE, STRIPE REGION, {1-101} SURFACE |
| 28.1° < θ < 45° | 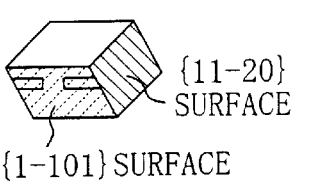 {11-20} SURFACE, {1-101} SURFACE | 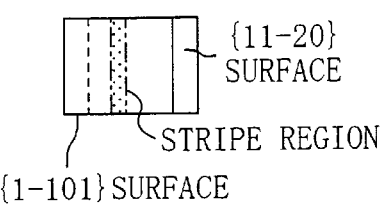 {11-20} SURFACE, STRIPE REGION, {1-101} SURFACE |
| θ = 28.1° | 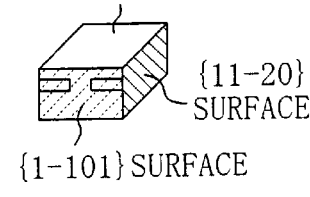 {0001} 28.1° OFF SURFACE, {11-20} SURFACE, {1-101} SURFACE | 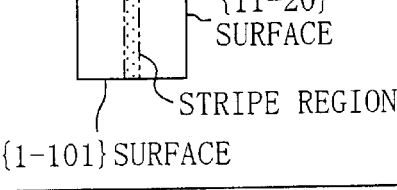 {11-20} SURFACE, STRIPE REGION, {1-101} SURFACE |

FIG. 6
| TILT ANGLE FROM {0001} SURFACE θ | PERSPECTIVE VIEW OF DEVICE | PLAN VIEW OF DEVICE |
|---|---|---|
| 28.1° < θ < 45° | 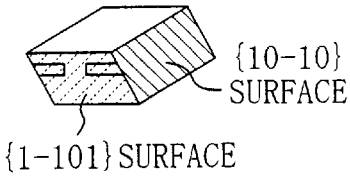 {10-10} SURFACE / {1-101} SURFACE | 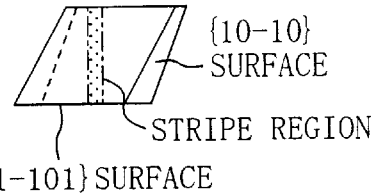 {10-10} SURFACE / STRIPE REGION / {1-101} SURFACE |
| θ = 28.1° | 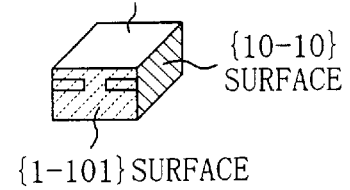 {0001} 28.1° OFF SURFACE / {10-10} SURFACE / {1-101} SURFACE | 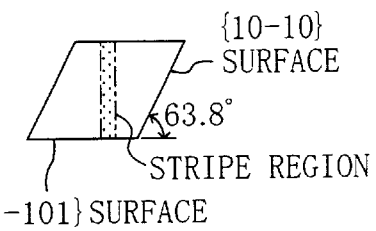 {10-10} SURFACE / 63.8° / STRIPE REGION / {1-101} SURFACE |

FIG. 7
| TILT ANGLE FROM {0001} SURFACE θ | PERSPECTIVE VIEW OF DEVICE | PLAN VIEW OF DEVICE |
|---|---|---|
| θ =90° | 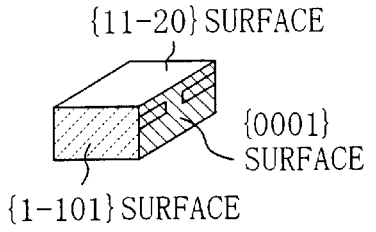 {11-20} SURFACE, {0001} SURFACE, {1-101} SURFACE | 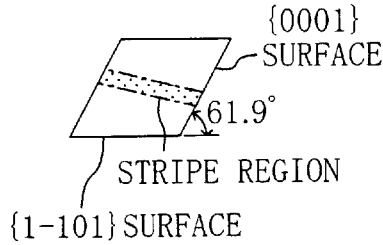 {0001} SURFACE, 61.9°, STRIPE REGION, {1-101} SURFACE |
| θ =28.1° | 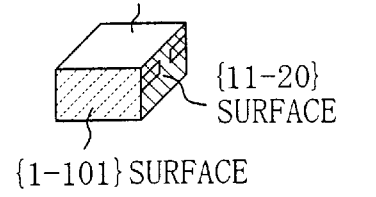 {0001} 28.1° OFF SURFACE, {11-20} SURFACE, {1-101} SURFACE | 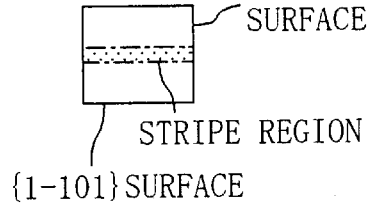 {11-20} SURFACE, STRIPE REGION, {1-101} SURFACE |
| θ =28.1° | 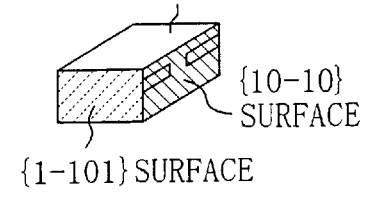 {0001} 28.1° OFF SURFACE, {10-10} SURFACE, {1-101} SURFACE | 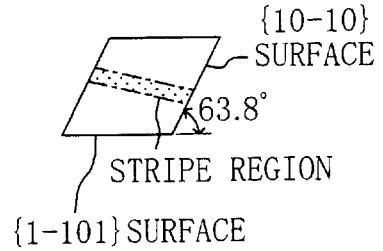 {10-10} SURFACE, 63.8°, STRIPE REGION, {1-101} SURFACE |

FIG. 9

| TILT ANGLE θ | PERSPECTIVE VIEW OF DEVICE | PLAN VIEW OF DEVICE |
|---|---|---|
| θ =90° | {11-20} SURFACE / {0001} SURFACE / {1-100} SURFACE | {0001} SURFACE / STRIPE REGION / {1-100} SURFACE |
| 45° ≦ θ < 90° | {0001} SURFACE / {1-100} SURFACE | {0001} SURFACE / STRIPE REGION / {1-100} SURFACE |
| 13° ≦ θ < 45° | {11-20} SURFACE / {1-100} SURFACE | {11-20} SURFACE / STRIPE REGION / {1-100} SURFACE |
| 0° < θ < 13° | {11-20} SURFACE / {1-100} SURFACE | {11-20} SURFACE / STRIPE REGION / {1-100} SURFACE |
| θ =0° | {0001} SURFACE / {11-20} SURFACE / {1-100} SURFACE | {11-20} SURFACE / STRIPE REGION / {1-100} SURFACE |

FIG. 10
| TILT ANGLE FROM {0001} SURFACE θ | PERSPECTIVE VIEW OF DEVICE | PLAN VIEW OF DEVICE |
|---|---|---|
| 28.1° < θ < 45° | 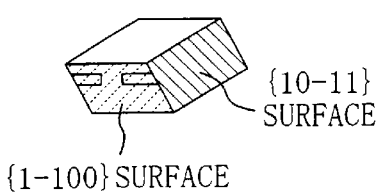 {10-11} SURFACE / {1-100} SURFACE | 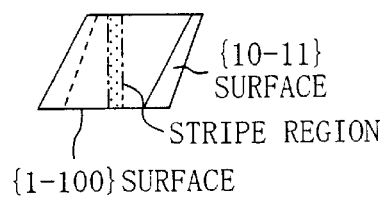 {10-11} SURFACE / STRIPE REGION / {1-100} SURFACE |
| θ = 28.1° | 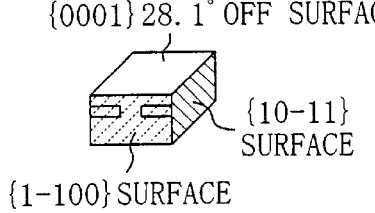 {0001} 28.1° OFF SURFACE / {10-11} SURFACE / {1-100} SURFACE | 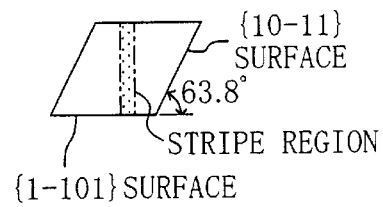 {10-11} SURFACE / 63.8° / STRIPE REGION / {1-101} SURFACE |
| 0° < θ < 28.1° | 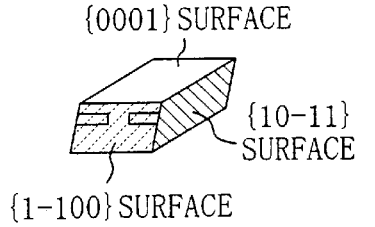 {0001} SURFACE / {10-11} SURFACE / {1-100} SURFACE | 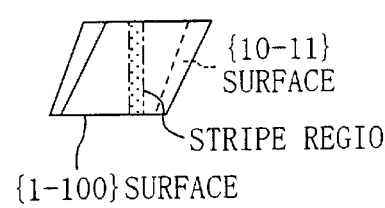 {10-11} SURFACE / STRIPE REGION / {1-100} SURFACE |
| θ = 0° | 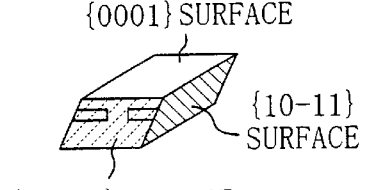 {0001} SURFACE / {10-11} SURFACE / {1-100} SURFACE | 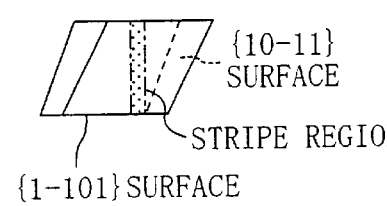 {10-11} SURFACE / STRIPE REGION / {1-101} SURFACE |

FIG. 11
| TILT ANGLE θ | PERSPECTIVE VIEW OF DEVICE | PLAN VIEW OF DEVICE |
|---|---|---|
| θ =90° | 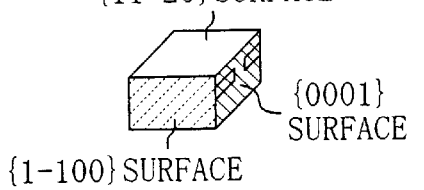 {11-20} SURFACE, {0001} SURFACE, {1-100} SURFACE | 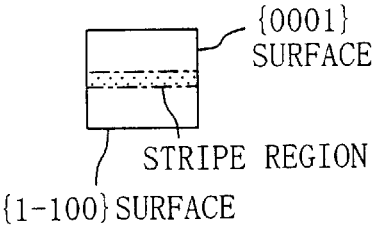 {0001} SURFACE, STRIPE REGION, {1-100} SURFACE |
| θ =28.1° | 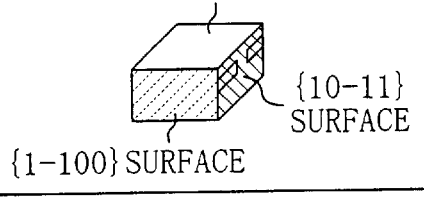 {0001} 28.1° OFF SURFACE, {10-11} SURFACE, {1-100} SURFACE | 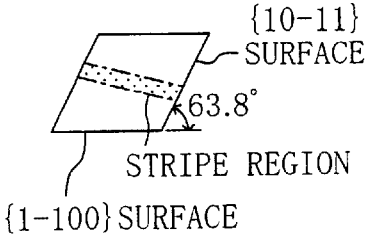 {10-11} SURFACE, 63.8°, STRIPE REGION, {1-100} SURFACE |

OPTICAL RESONATOR SURFACE

NITRIDE SEMICONDUCTOR DEVICE

BACKGROUND OF THE INVENTION

The present invention relates to a nitride semiconductor device such as a blue laser used for high-density optical recording.

FIG. 14 illustrates a nitride semiconductor laser device disclosed in Japanese Laid-Open Patent Publication No. 8-153931. This semiconductor laser device includes a sapphire substrate 1 using the (0001) surface as its main surface and a layered structure formed thereon. The layered structure is formed by sequentially growing a first cladding layer 2, an active layer 4, and a second cladding layer 6, which are all made of nitride semiconductor layers using the (0001) surface as their main surfaces. The layered structure is then cut along a surface equivalent to the (1-100) surface of the sapphire substrate 1, to obtain an optical resonator surface. Note that as used herein "−1" refers to the inversion of "1" and "−2" refers to the inversion of "2".

The conventional nitride semiconductor laser device has a problem as follows. Since the sapphire substrate 1, which is made of hexagonal crystal, uses the (0001) surface as its main surface, there exist only a small number of atomic steps on the surface of the substrate. This tends to cause composition separation in the active layer 4. Occurrence of composition separation in the active layer 4 results in increase in the threshold current of the laser and thus increase in power consumption. It is therefore necessary to minimize occurrence of composition separation in the active layer 4.

The above problem arises not only in a nitride semiconductor laser having an active layer, but also in a nitride semiconductor device having a function region other than the active layer, such as a transistor.

SUMMARY OF THE INVENTION

An object of the present invention is to improve the yield of a nitride semiconductor device by minimizing occurrence of composition separation in a function region such as an active region.

In order to attain the above object, the first nitride semiconductor device of the invention includes: a substrate made of a III–V group compound semiconductor containing nitride; and a function region made of a III–V group compound semiconductor layer containing nitride formed on a main surface of the substrate, wherein the main surface of the substrate is a surface tilted from a {0001} plane by an angle in a range of 13° to 90° inclusive.

According to the first nitride semiconductor device, where the main surface of the substrate is a surface tilted from a {0001} plane by an angle in a range of 13° to 90° inclusive, occurrence of composition separation in the function region is prevented. This improves the yield of the nitride semiconductor device.

In the first nitride semiconductor device, the main surface of the substrate is preferably perpendicular to a {11-20} plane.

With the above construction, primary cleavage can be performed along the {11-20} plane over the entire substrate by applying a force in the direction along the {11-20} plane with a scribe cutter blade that is positioned perpendicular to the main surface.

In the first nitride semiconductor device, preferably, the function region is an active layer that emits light, and a {11-20} plane of the substrate is an optical resonator surface.

With the above construction, it is possible to realize a semiconductor laser device where the {11-20} plane perpendicular to the main surface of the substrate is the optical resonator surface.

In the first nitride semiconductor device, the main surface of the substrate is preferably a {11-20} plane.

With the above construction, secondary cleavage can be performed along the {0001} plane that is perpendicular to the main surface of the substrate. This facilitates the secondary cleavage and also makes it possible to form a device in the shape of a rectangular parallelepiped.

In the case where the main surface of the substrate is a {1-100} plane, preferably, the function region is an active layer that emits light, and the {0001} plane of the substrate is an optical resonator surface.

In the case where the main surface of the substrate is a {1-100} surface, preferably, the function region is an active layer that emits light, and the {0001} surface of the substrate is an optical resonator surface.

With the above construction, it is possible to realize a semiconductor laser device in the shape of a rectangular parallelepiped where the secondary cleavage surface is the optical resonator surface.

In the first nitride semiconductor device, the main surface of the substrate is preferably a surface tilted from the {0001} plane by 28.1° in a direction equivalent to a direction.

With the above construction, secondary cleavage can be performed along a {1-101} plane that is perpendicular to the main surface of the substrate. This facilitates the secondary cleavage and also makes it possible to form a device in the shape of a rectangular parallelepiped.

In the case where the main surface of the substrate is a surface tilted from the {0001} plane by 28.1° in a direction equivalent to a direction, preferably, the function region is an active layer that emits light, and a {1-101} plane of the substrate is an optical resonator surface.

With the above construction, it is possible to realize a semiconductor laser device in the shape of a rectangular parallelepiped where the secondary cleavage surface is the optical resonator surface.

The second nitride semiconductor device of the present invention includes a substrate made of III–V group compound semiconductor containing nitride; and a function region made of a III–V group compound semiconductor layer containing nitride formed on a main surface of the substrate, wherein the main surface of the substrate is perpendicular to a {1-101} plane.

According to the second nitride semiconductor device, the main surface of the substrate has a tilt angle of 13° or more from a {0001} plane, and thus occurrence of composition separation in a function region is prevented. This improves the yield of the nitride semiconductor device.

In the second nitride semiconductor device, preferably, the function region is an active layer that emits light, and the {1-101} plane of the substrate is an optical resonator surface.

With the above construction, it is possible to realize a semiconductor laser device where the primary cleavage surface is the optical resonator surface.

In the second nitride semiconductor device, the main surface of the substrate is preferably a {11-20} plane.

With the above construction, secondary cleavage can be performed along a {0001} plane that is perpendicular to the main surface of the substrate. This facilitates the secondary cleavage.

In the case where the main surface of the substrate is a {11-20} plane, preferably, the function region is an active layer that emits light, and a {1-101} plane of the substrate is an optical resonator surface.

With the above construction, it is possible to realize a semiconductor laser device in the shape of a rectangular parallelepiped where the primary cleavage surface is the optical resonator surface.

In the second nitride semiconductor device, the main surface of the substrate is preferably a surface tilted from a {0001} plane by 28.1° in a direction.

With the above construction, secondary cleavage can be performed along the {11-20} plane that is perpendicular to the main surface of the substrate. This facilitates the secondary cleavage and also makes it possible to form a device in the shape of a rectangular parallelepiped.

In the case where the main surface of the substrate is a surface tilted from a {0001} plane by 28.1° in a direction, preferably, the function region is an active layer that emits light, and a {11-20} plane of the substrate is an optical resonator surface.

With the above construction, it is possible to realize a semiconductor laser device in the shape of a rectangular parallelepiped where the secondary cleavage surface is the optical resonator surface.

In the case where the main surface of the substrate is a surface tilted from a {0001} plane by 28.1° in a direction, preferably, the function region is an active layer that emits light, and a {10—10} plane of the substrate is an optical resonator surface.

With the above construction, it is possible to realize a semiconductor laser device in the shape of a rectangular parallelepiped where the secondary cleavage surface is the optical resonator surface.

In the case where the main surface of the substrate is a surface tilted from a {0001} plane by 28.1° in a direction, preferably, the function region is an active layer that emits light, and a {10—10} plane of the substrate is an optical resonator surface.

With the above construction, it is possible to realize a semiconductor laser device where the secondary cleavage surface is the optical resonator surface.

The third nitride semiconductor device of the present invention includes: a substrate made of a III–V group compound semiconductor containing nitride; and a function region made of a III–V group compound semiconductor layer containing nitride formed on a main surface of the substrate, wherein the main surface of the substrate is a surface tilted from a {0001} plane by an angle in a range of 13° to 90° inclusive.

According to the third nitride semiconductor device, where the main surface of the substrate is a surface tilted from a {0001} plane by an angle in a range of 13° to 90° inclusive, occurrence of composition separation in a function region is prevented. This improves the yield of the nitride semiconductor device.

In the third nitride semiconductor device, preferably, the function region is an active layer that emits light, and a {1-100} plane of the substrate is an optical resonator surface.

With the above construction, it is possible to realize a semiconductor laser device where the primary cleavage surface is the optical resonator surface.

In the third nitride semiconductor device, the main surface of the substrate is preferably a {11-20} plane.

With the above construction, primary cleavage can be performed along the {11-20} plane over the entire substrate by applying a force in the direction along the {11-20} surface with a scribe cutter blade that is positioned perpendicular to the main surface.

In the case where the main surface of the substrate is a {11-20} plane, preferably, the function region is an active layer that emits light, and the {0001} plane of the substrate is an optical resonator surface.

With the above construction, it is possible to realize a semiconductor laser device in the shape of a rectangular parallelepiped where the secondary cleavage surface is the optical resonator surface.

In the third nitride semiconductor device, the main surface of the substrate is preferably a surface tilted from the {0001} plane by 28.1° in a direction.

With the above construction, secondary cleavage can be performed along the {1-100} plane that is perpendicular to the main surface of the substrate. This facilitates the secondary cleavage.

In the case where the main surface of the substrate is a surface tilted from the {0001} plane by a 28.1° in a direction, preferably, the function region is an active layer that emits light, and a {10-11} plane of the substrate is an optical resonator surface.

With the above construction, it is possible to realize a semiconductor laser device where the primary cleavage surface is the optical resonator surface.

BRIEF DESCRIPTION OF THE DRAWINGS

FIG. 2 illustrates the relationship between the tilt angle θ and the primary and secondary cleavage surfaces in the semiconductor laser device of the first embodiment of the present invention.

FIG. 3 illustrates the relationship between the tilt angle θ and the primary and secondary cleavage surfaces in the semiconductor laser device of the first embodiment of the present invention.

FIG. 5 illustrates the relationship between the tilt angle θ and the primary and secondary cleavage surfaces in the semiconductor laser device of the second embodiment of the present invention.

FIG. 6 illustrates the relationship between the tilt angle θ and the primary and secondary cleavage surfaces in the semiconductor laser device of the second embodiment of the present invention.

FIG. 7 illustrates the relationship between the tilt angle θ and the primary and secondary cleavage surfaces in the semiconductor laser device of the second embodiment of the present invention.

FIG. 9 illustrates the relationship between the tilt angle θ and the primary and secondary cleavage surfaces in the semiconductor laser device of the third embodiment of the present invention.

FIG. 10 illustrates the relationship between the tilt angle θ and the primary and secondary cleavage surfaces in the semiconductor laser device of the third embodiment of the present invention.

FIG. 11 illustrates the relationship between the tilt angle θ and the primary and secondary cleavage surfaces in the semiconductor laser device of the third embodiment of the present invention.

FIG. 12(a) shows the case of the first embodiment and FIG. 12(b) shows the conventional case.

DESCRIPTION OF EMBODIMENTS OF THE INVENTION

Hereinafter, nitride semiconductor devices of embodiments of the present invention will be described with reference to the accompanying drawings. Note that as used herein a {11-20} plane, for example, generically represents any of the (11-20) surface and surfaces equivalent to the (11-20) surface, and a direction generically represents any of the <11-20> direction and directions equivalent to the <11-20> direction.

(First Embodiment)

Hereinafter, a nitride semiconductor laser device of the first embodiment, as well as a fabrication method thereof, will be described with reference to FIGS. 1, 2, and 3.

Figure 1:
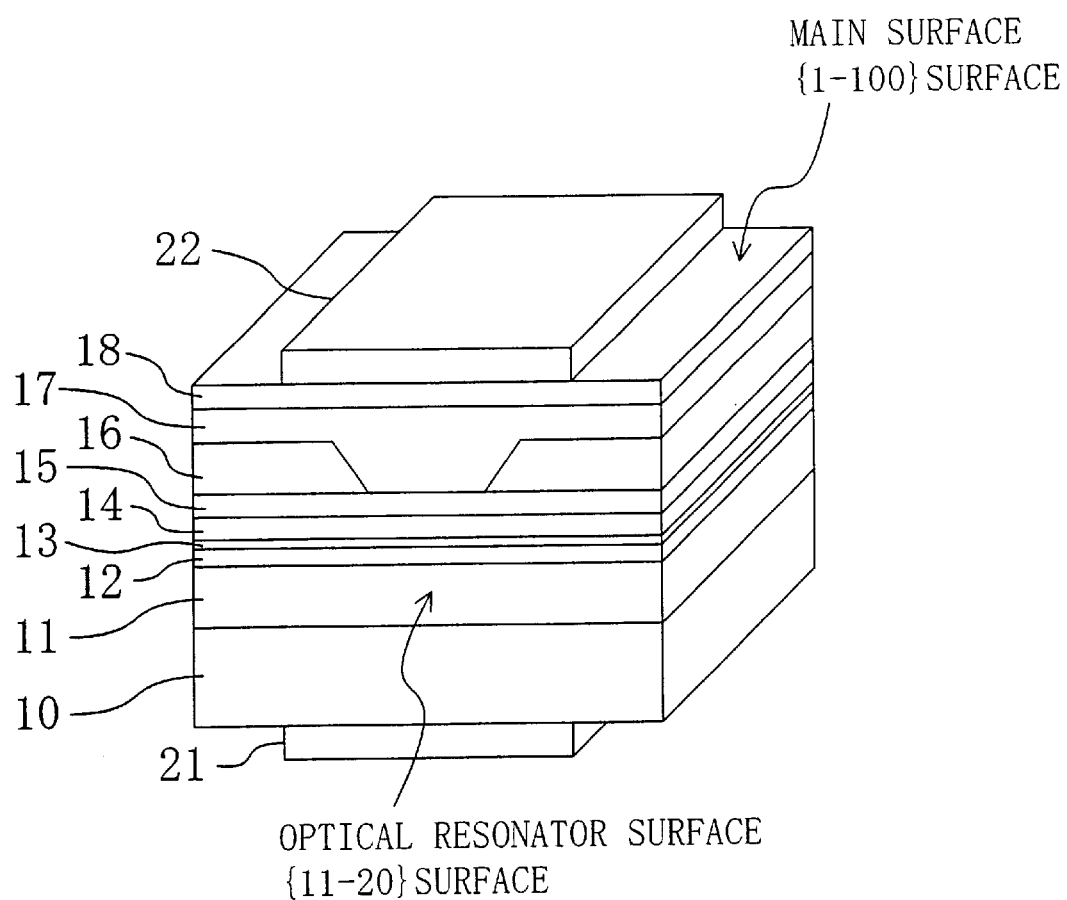
FIG. 1 is a perspective view of a semiconductor laser device of the first embodiment of the present invention.

Referring to FIG. 1, a first cladding layer 11 made of an n-type AlGaN layer and a first optical guide layer 12 made of an n-type GaN layer are grown on an n-type gallium nitride substrate 10 in a chamber of a metal-organic chemical vapor deposition (MOCVD) apparatus at a substrate temperature of 1000° C. The gallium nitride substrate 10 has a main surface that is a surface perpendicular to a {11-20} plane and tilted (made off) from a {0001} plane by a predetermined angle.

Thereafter, an active layer 13 made of an undoped InGaN layer having a quantum well structure is grown on the first optical guide layer 12 at a substrate temperature reduced to 800° C.

The substrate temperature is then raised to 100° C. again, and sequentially grown on the active layer 13 are a second optical guide layer 14 made of a p-type GaN layer, a second cladding layer 15 made of a p-type Al GaN layer, and a current blocking layer 16 made of an n-type AlGaN layer.

The resultant substrate is then transported from the MOCVD apparatus to a reactive ion etching (RIE) apparatus, to etch the current blocking layer 16, forming a stripe-shaped current narrowing region (hereinafter, referred to as a stripe region) having a width of 2 μm extending in a [11-20] direction.

The substrate is transported back to the MOCVD apparatus, and a third cladding layer 17 made of a p-type AlGaN layer and a contact layer 18 made of a p-type GaN layer are sequentially grown on the current blocking layer 16 with the stripe region formed therethrough at a substrate temperature of 1000° C. Thus, the process of growing the semiconductor layers is completed. The orientations of the main surfaces of the semiconductor layers in the growing process are the same as that of the main surface of the gallium nitride substrate 10.

Thereafter, a negative electrode 21 made of an n-type Ti/Au film is formed on the bottom surface of the gallium nitride substrate 10, and a positive electrode 22 made of a p-type Ni/Au film is formed on the top surface of the contact layer 18. In this way, the wafer process is completed.

Subsequently, primary cleavage is performed for the resultant wafer of gallium nitride substrate 10 along the {11-20} plane as the primary cleavage surface, to obtain an optical resonator surface of the {11-20} plane perpendicular to the main surface of the substrate.

Since the main surface of the substrate has been set to be a surface perpendicular to the {11-20} plane, the primary cleavage along the {11-20} plane is possible over the entire wafer by applying a force in the direction along the {11-20} plane with a scribe cutter blade that is positioned perpendicular to the main surface. In this way, a bar-shaped layered structure as an array of laser devices is obtained.

Secondary cleavage is then performed for the primary-cleaved bar-shaped layered structure, to obtain the semiconductor laser device of the first embodiment.

FIGS. 2 and 3 illustrate the relationship between the tilt angle θ from the {0001} plane (hereinafter, simply referred to as the tilt angle) and the primary and secondary cleavage surfaces in the semiconductor laser device of the first embodiment.

As is found from FIG. 2, when the tilt angle θ is in the range of 45° to 90° inclusive, the secondary cleavage surface is the {0001} plane. In the illustrated case in FIG. 2, the direction of the stripe region is the direction.

In particular, when the tilt angle θ is 90°, that is, when the main surface is a {1-100} plane, the secondary cleavage surface that is the {0001} plane is perpendicular to the main surface. This greatly facilitates the secondary cleavage, and also makes it possible to obtain a device in the shape of a rectangular parallelepiped.

When the tilt angle θ is equal to or more than 13° and less than 45°, the secondary cleavage surface is a {1-101} plane.

In particular, when the tilt angle θ is 28.1°, the secondary cleavage surface that is the {1-101} plane is perpendicular to the main surface. This greatly facilitates the secondary cleavage, and also makes it possible to obtain a device in the shape of a rectangular parallelepiped.

In the first embodiment, the secondary cleavage surface is perpendicular to the main surface when the tilt angle θ is 90° or 28.1°. In such a case, therefore, the direction of the stripe region may be different from the [11-20] direction. This is described below with reference to FIG. 3.

As shown in the upper row of FIG. 3, when the tilt angle θ is 90°, the stripe region may extend in a [0001] direction. In this case, the primary cleavage surface is the {0001} surface while the secondary cleavage surface is the {11-20} surface.

As shown in the upper row of FIG. 3, when the tilt angle θ is 90°, the stripe region may extend in a [0001] direction. In this case, the primary cleavage surface is the {0001} plane while the secondary cleavage surface is the {11-20} plane.

As shown in the lower row of FIG. 3, when the tilt angle θ is 28.1°, the stripe region may extend in a direction. In this case, the primary cleavage surface is the {1-101} plane while the secondary cleavage surface is the {11-20} plane.

Referring back to FIG. 2, when the tilt angle θ is less than 13° and equal to or more than 0°, the secondary cleavage surface is a {1-100} plane.

The secondary cleavage surface is not perpendicular to the main surface when the tilt angle is any value other than 90°, 28.1°, and 0°. In this case, therefore, secondary cleavage is somewhat difficult. However, the secondary cleavage in a slanted direction is possible because the secondary cleavage is performed along a short-side face of the bar-shaped layered structure as an array of laser devices and thus the cleavage length is very short.

The tilt angle θ is preferably 13° or more for the following reason.

Figure 12A:
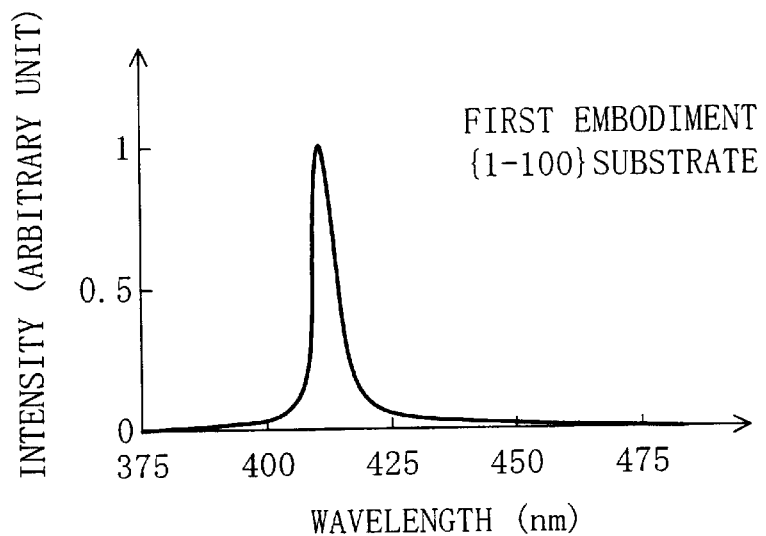
FIGS. 12(a) and 12(b) are views representing emission spectra obtained when a current equal to or less than a threshold current is applied to a semiconductor laser device, where
Figure 12B:
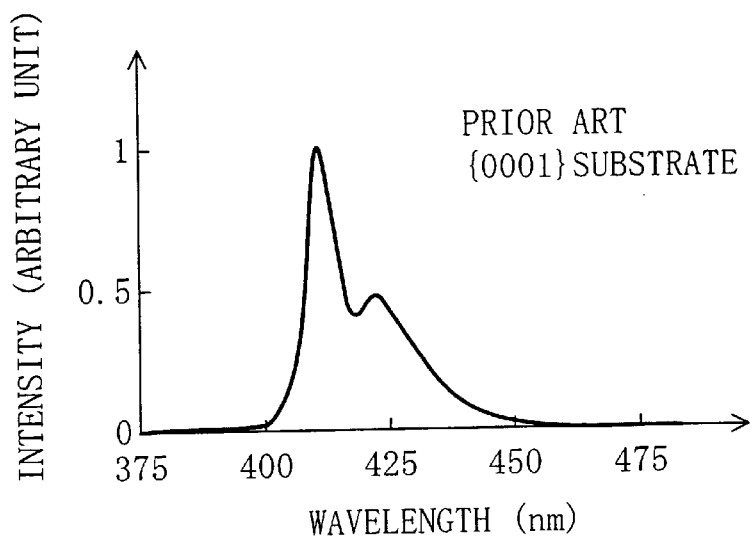

FIGS. 12(a) and 12(b) represent spontaneous emission spectra, that is, emission spectra observed when a current equal to or less than a threshold current is applied to a semiconductor laser device. FIG. 12(a) shows the case where the tile angle θ is 90° in the first embodiment, that is, the case of a semiconductor laser device obtained by growing semiconductor layers on the {1-100} plane. FIG. 12(b) shows the case where the tilt angle θ is 0°, that is, the case of a semiconductor laser device obtained by growing semiconductor layers on the {0001} plane, which corresponds to a conventional semiconductor device. It should be understood that an emission spectrum actually exhibits a variation in intensity of emission in a cycle of several nanometers depending on the resonator mode. In this measurement, however, since the resolving power of the spectroscope used was lowered to enhance the sensitivity, observed are envelopes of emission spectra.

While two intensity peaks are observed when the tilt angle θ is 0 as shown in FIG. 12(b), only one intensity peak is observed when the tilt angle θ is 90° as shown in FIG. 12(a).

The reason why two intensity peaks are observed when tilt angle θ is 0° is that composition separation occurs on the {0001} plane, that is, two compositions exist on the {0001} plane. In addition, a region having a band gap that does not match the oscillating wavelength fails to contribute to laser oscillation. Therefore, existence of such a region reduces the substantial volume of the active layer that contributes to oscillation.

Composition separation was also observed when the tilt angle θ was less than 13°, not only when it was 0°.

On the contrary, composition separation was hardly observed-when the tilt angle θ was 13° or more.

When the tilt angle θ exceeds 90°, the results are the same as those obtained when the tilt angle θ is less than 90° because of the symmetry of crystal.

Figure 13:
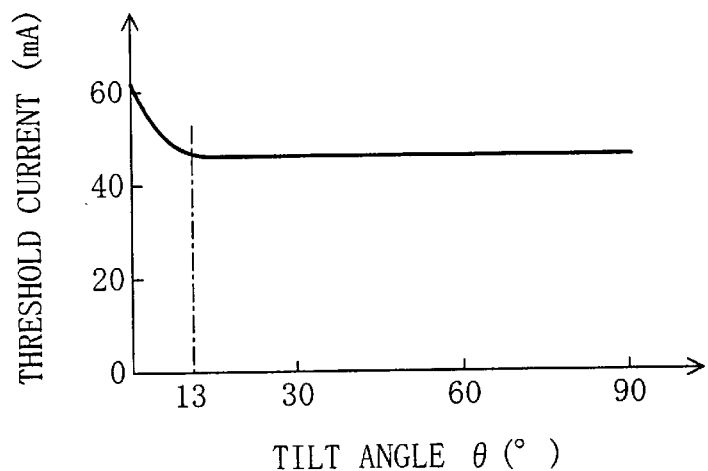
FIG. 13 is a characteristic view showing the relationship between the tilt angle θ and the laser oscillation threshold value in a semiconductor laser device.
Figure 14:
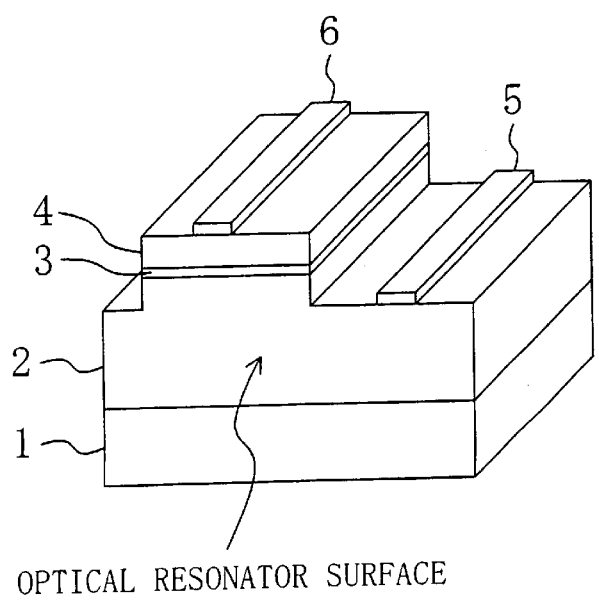
FIG. 14 is a perspective view of a conventional semiconductor laser device.

FIG. 13 shows the relationship between the tilt angle θ and the laser oscillation threshold current, one of the current-optical density characteristics. As is found from FIG. 13, the threshold current sharply increases as the tilt angle θ decreases below 13°.

From the above, it is confirmed that when the tilt angle θ is less than 13°, composition separation occurs, which increases the threshold current.

According to the semiconductor laser device of the first embodiment, where the main surface is tilted from the {0001} plane by 13° or more, no composition separation occurs in the active layer.

(Second Embodiment)

Figure 4:
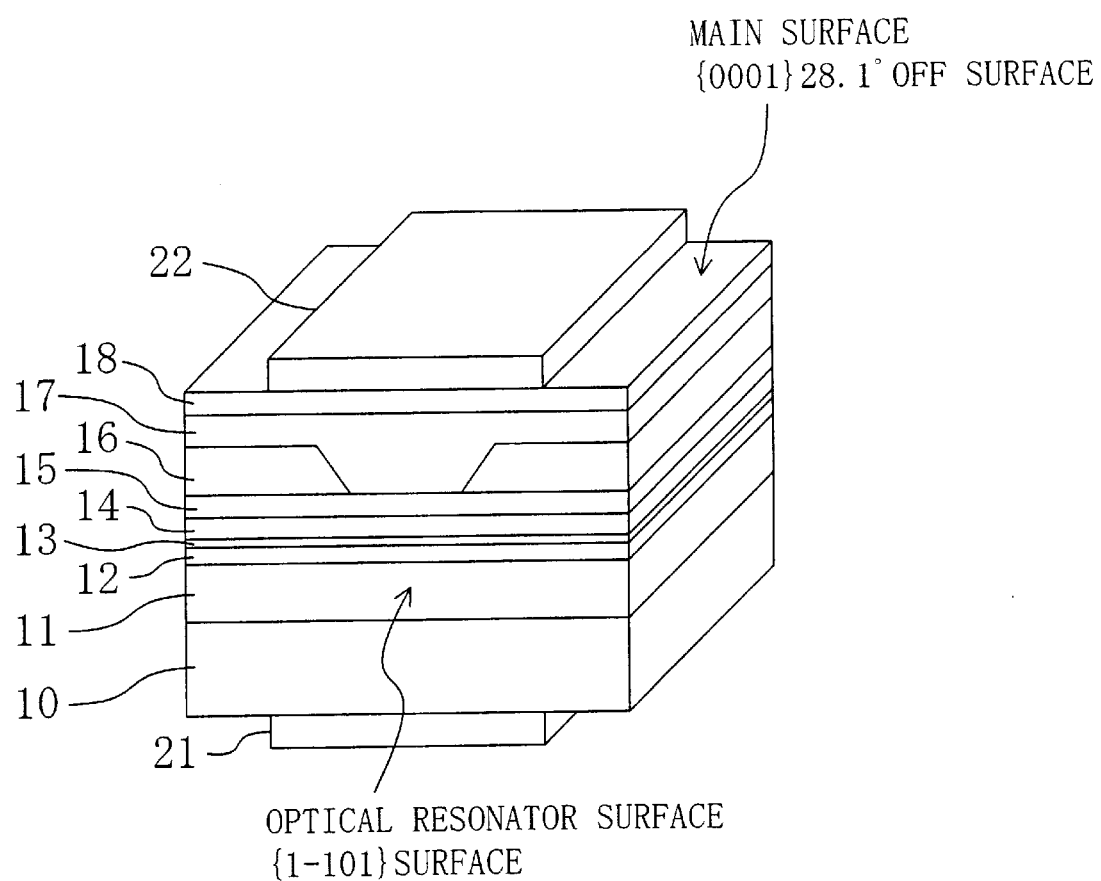
FIG. 4 is a perspective view of a semiconductor laser device of the second embodiment of the present invention.
Figure 8:
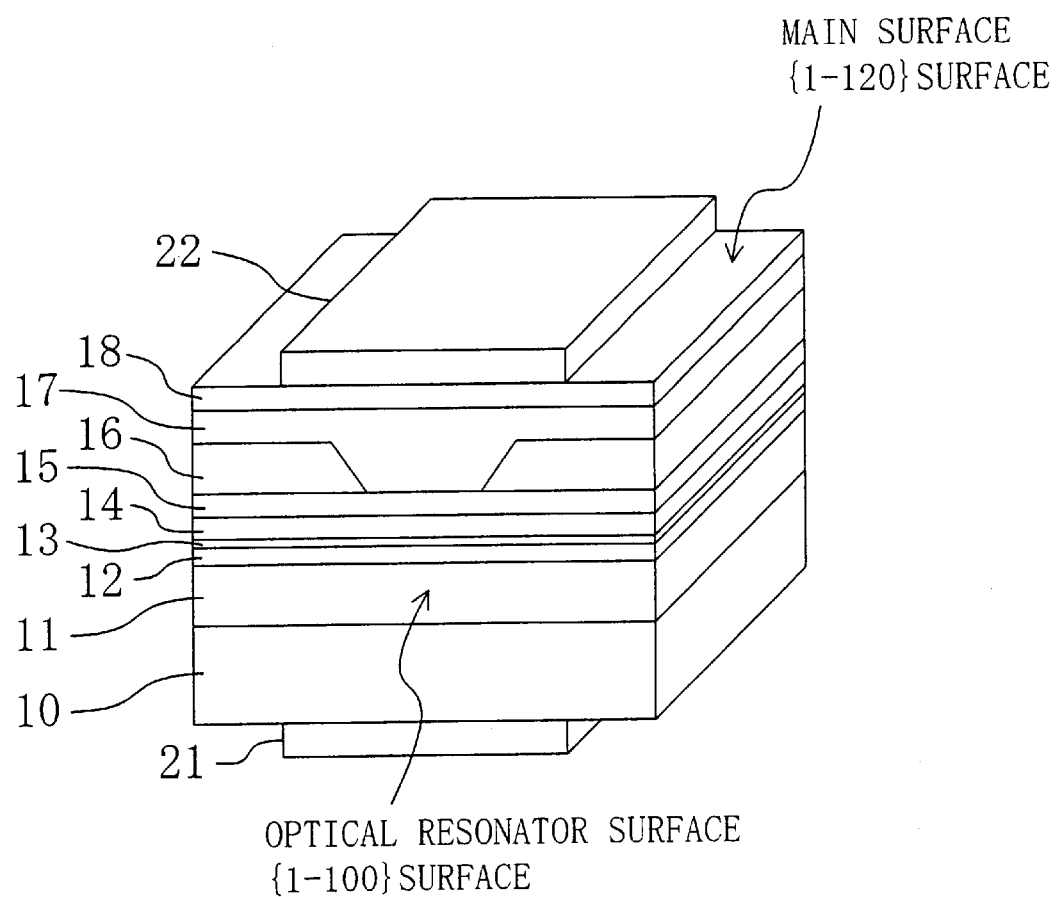
FIG. 8 is a perspective view of a semiconductor laser device of the third embodiment of the present invention.

A nitride semiconductor laser device of the second embodiment of the present invention, as well as a fabrication method thereof, will be described with reference to FIGS. 4, 5, and 6.

The nitride semiconductor laser device of the second embodiment has a main surface that is perpendicular to a {1-101} plane. An example of surfaces perpendicular to the {1-101} plane is a surface tilted from a {0001} plane by 28.1° in a direction.

Hereinafter, a method for fabricating a nitride semiconductor laser device having a main surface as described above will be described.

On an n-type gallium nitride substrate 10 having a main surface perpendicular to the {1-101} plane, formed sequentially by MOCVD are: a first cladding layer 11 made of an n-type AlGaN layer; a first optical guide layer 12 made of an n-type GaN layer; an active layer 13 made an undoped InGaN layer having a quantum well structure; a second optical guide layer 14 made of a p-type GaN layer; a second cladding layer 15 made of a p-type AlGaN layer; and a current blocking layer 16 made of an n-type AlGaN layer.

The current blocking layer 16 is then etched to form a stripe-shaped current narrowing region (hereinafter, referred to as a stripe region) extending in a [1-101] direction.

Thereafter, a third cladding layer 17 made of a p-type AlGaN layer and a contact layer 18 made of a p-type GaN layer are sequentially grown on the current blocking layer 16 with the stripe region formed therethrough.

Subsequently, a negative electrode 21 is formed on the bottom surface of the gallium nitride substrate 10, and a positive electrode 22 is formed on the top surface of the contact layer 18. In this way, the wafer process is completed.

Primary cleave is then performed for the resultant wafer along the {1-101} plane as the primary cleavage surface, to obtain an optical resonator surface of the laser device.

Since the main surface of the substrate has been set to be a surface perpendicular to the {1-101} plane, the primary cleavage along the {1-101} plane is possible over the entire wafer by applying a force in the direction along the {1-101} plane with a scribe cutter blade that is positioned perpendicular to the main surface. In this way, a bar-shaped layered structure as an array of laser devices is obtained.

Secondary cleavage is then performed for the primary-cleaved bar-shaped layered structure, to obtain the semiconductor laser device of the second embodiment. ductor laser device of the second embodiment.

FIGS. 5 through 7 illustrate the relationship between the tilt angle θ from the {0001} plane and the primary and secondary cleavage surfaces in the semiconductor laser device of the second embodiment.

In the second embodiment, the main surface is perpendicular to the {1-101} plane. In the case of the gallium nitride, the {1-101} plane is tilted by 61.9° from the {0001} plane. In this case, therefore, there is no main surface having a tilt angle θ of less than 28.1° from the {0001} plane.

As is found from FIG. 5, when the tilt angle θ is 45° or more, the {0001} plane can be as the secondary cleavage surface.

In particular, when the tilt angle θ is 90°, the main surface is a {11-20} plane, and the secondary cleavage surface that is the {0001} plane is perpendicular to the main surface. This advantageously facilitates the secondary cleavage. In this case, since the {0001} plane is tilted by 61.9° from the {1-101} plane, the main surface is in the shape of a parallelogram. This shape however will not adversely affect laser operation because laser oscillation is possible as long as the optical resonator surface is perpendicular to the stripe region.

When the tilt angle θ is equal to or more than 45° and less than 90°, the optical resonator surface is also in the shape of a parallelogram. In this case, also, fabrication of a laser device is possible as long as the pair of primary cleavage surfaces are in parallel with each other.

When the tilt angle θ is less than 45° and equal to or more than 28.1°, secondary cleavage can be performed along the {11-20} plane as the secondary cleavage surface.

In particular, when the main surface of the substrate is a surface tilted from the {0001} plane by 28.1° in a direction equivalent to the direction, the secondary cleavage surface is the {11-20} plane that is perpendicular to both the main surface and the optical resonator surface. Therefore, the resultant laser device is advantageously in the shape of a rectangular parallelepiped.

When the tilt angle θ is in the vicinity of 45°, the secondary cleavage surface may be the {0001} plane or the {11-20} plane. That is, control of the secondary cleavage surface is possible by controlling the direction in which a force is applied with the scribe cutter blade.

FIG. 6 illustrates the cases where secondary cleavage is performed along a surface different from the secondary cleavage surface shown in FIG. 5 when the tilt angle θ is less than 45° and equal to or more than 28.1°. As is found from FIG. 6, the secondary cleavage surface a {10—10} plane when the tilt angle θ is less than 45° and equal to or more than 28.1°.

In the case of gallium nitride, the angle formed between the specific (1-101) surface and the (10—10) surface is 63.8°. Also, the angles formed by the specific (1-101) surface with the (-1010), (01-10), and (0-110) surfaces are 63.8°. Contrarily, the angles formed between surfaces oriented in the same direction as the (-1101) surface in the C surface, such as the angle formed between the (1-101) surface and the (1-100) surface and the angle formed between the (1-101) surface and the (-1100) surface, are all 28.1°. In the following description, an equivalent surface in a different direction in the C surface is indicated by changing the order of the first to third indices. For example, the indices of the {1-100} plane are changed to obtain the {10—10} plane. In the case of gallium nitride, surfaces forming the angle of 63.8° with respect to the {1-100} plane are herein generically represented by the {10—10} plane obtained by changing the first to third indices.

In particular, when the main surface is a surface tilted from the {0001} plane by 28.1° in a direction equivalent to the direction, the secondary cleavage surface that is the {1-100} plane is perpendicular to the main surface. This advantageously facilitates the secondary When the tilt angle θ is less than 45° and equal to or more than 28.1°, the {11-20} plane {1-100} plane may be selected as the secondary cleavage surface. Control of the secondary cleavage surface is possible by controlling the direction in which a force is applied with the scribe cutter blade or by scribing a line along the cleavage direction, for example.

In the second embodiment, the secondary cleavage surface is perpendicular to the main surface when the tilt angle θ is 90° or 28.1°. Therefore, the stripe region may extend in a direction other than the [1-101] direction. This is described with reference to FIG. 7.

As shown in the top row of FIG. 7, when the tilt angle θ is 90° in FIG. 5, the stripe region may extend in the direction. In this case, the primary cleavage surface is {0001} plane while the secondary cleavage surface is the {1-101} plane.

As shown in the middle row of FIG. 7, when the tilt angle θ is 28.1° in FIG. 5, the stripe region may extend in the direction. In this case, the primary cleavage is the {11-20} plane while the secondary cleavage surface is the {1-101} plane.

As shown in the bottom row of FIG. 7, when the tilt angle θ is 28.1° in FIG. 6, the stripe region may extend in the direction. In this case, the primary cleavage surface is the {10—10} plane while the secondary cleavage surface is the {1-101} plane.

According to the semiconductor laser device of the second embodiment, where the main surface is tilted from the {0001} plane by 13° or more, there is no occurrence of composition separation in the active layer.

(Third Embodiment)

Hereinafter, a nitride semiconductor laser device of the third embodiment of the present invention, as well as a fabrication method thereof, will be described with reference to FIGS. 8, 9, 10, and 11.

The nitride semiconductor laser device of the third embodiment has a main surface that is perpendicular to a {1-100} plane and has a tilt angle θ of 13° or more from a {0001} plane. A {11-20} plane is an example of surfaces perpendicular to the {1-100} plane and having a tilt angle θ of 13° or more from the {0001} plane.

Hereinafter, a method for fabricating a nitride semiconductor laser device having a main surface as described above will be described.

On an n-type gallium nitride substrate 10 having a main surface perpendicular to the {1-100} plane, formed sequentially by MOCVD are: a first cladding layer 11 made of an n-type AlGaN layer; a first optical guide layer 12 made of an n-type GaN layer; an active layer 13 made of an undoped InGaN layer having a quantum well structure; a second optical guide layer 14 made of a p-type GaN layer; a second cladding layer 15 made of a p-type AlGaN layer; and a current blocking layer 16 made of an n-type AlGaN layer.

The current blocking layer 16 is then etched to form a stripe-shaped current narrowing region (hereinafter, referred to as a stripe region) extending in a [1-100] direction.

Thereafter, a third cladding layer 17 made of a p-type AlGaN layer and a contact layer 18 made of a p-type GaN layer are sequentially grown on the current blocking layer 16 with the stripe region formed therethrough.

Subsequently, a negative electrode 21 is formed on the bottom surface of the gallium nitride substrate 10, and a positive electrode 22 is formed on the top surface of the contact layer 18. In this way, the wafer process is completed.

Primary cleavage is then performed for the resultant wafer along the {1-100} plane as the primary cleavage surface, to obtain an optical resonator surface of the laser device.

Since the main surface of the substrate has been set to be a surface perpendicular to the {1-100} plane, the primary cleavage along the {1-100} plane is possible over the entire wafer by applying a force in the direction along the {1-100} plane. In this way, a bar-shaped layered structure as an array of laser devices is obtained.

Secondary cleavage is then performed for the primary-cleaved bar-shaped layered structure, to obtain the semiconductor laser device of the third embodiment.

FIGS. 9 through 11 illustrate the relationship between the tilt angle from the {0001} plane and the primary and secondary cleavage surfaces in the semiconductor laser device of the third embodiment.

As is found from FIG. 9, when the tilt angle θ is in the range of 45° to 90° inclusive, the {0001} plane can be used as the secondary cleavage surface.

In particular, when the tilt angle θ is 90°, the main surface is a {11-20} plane. Therefore, the secondary cleavage surface is in the same surface as the optical resonator surface and the main surface of the substrate. The resultant laser device advantageously has the shape of a rectangular parallelepiped.

Using the substrate having the main surface described above, it is possible to fabricate a laser device having a stripe region extending in the [0001] direction.

When the tilt angle θ is less than 45°, a {11-20} surface can be used as the secondary cleavage surface.

When the tilt angle θ is less than 45°, a {11-20} plane can be used as the secondary cleavage surface.

When the tilt angle θ is less than 13°, having the {11-20} plane as the secondary cleavage surface, composition separation disadvantageously occurs in the active layer.

No composition separation occurs in the active layer when the main surface of the semiconductor laser is set to be a surface tilted from the {0001} plane by 13° or more.

FIG. 10 illustrates the cases where secondary cleavage is performed along a surface different from the secondary cleavage surface shown in FIG. 9 when the tilt angle θ is less than 45°. As is found from FIG. 10, the secondary cleavage surface can be a {10-11} plane when the tilt angle θ is less than 45°.

In the case of gallium nitride, surfaces forming an angle of 63.8° with respect to the {1-100} plane are herein generically represented by the {10-11} plane.

Since the {10-11} plane forms the angle of 63.8° with respect to the {1-100} plane, the main surface is in the shape of a parallelogram. This shape however will not adversely affect laser operation because laser oscillation is possible as long as the optical resonator surface is perpendicular to the stripe region.

When the tilt angle θ is less than 13°, composition separation disadvantageously occurs in the active layer, resulting in increase in laser threshold value.

When the tilt angle θ is less than 45° and equal to or more than 28.1°, either the {11-20} plane or the {1-100} plane may be selected as the secondary cleavage surface. Control of the resultant secondary cleavage surface is possible by controlling the direction in which a force is applied with the scribe cutter blade or by scribing a line along the cleavage direction, for example.

In the third embodiment, the secondary cleavage surface is perpendicular to the main surface when the tilt angle θ is 90° or 28.1°. Therefore, the stripe region may extend in a direction other than the [1-100] direction. This is described with reference to FIG. 11.

As shown in the upper row of FIG. 11, when the tilt angle θ is 90° in FIG. 9, the stripe region may extend in the direction. In this case, the primary cleavage surface is the {0001} plane while the secondary cleavage surface is the {1-100} plane.

As shown in the lower row of FIG. 11, when the tilt angle θ is 28.1° in FIG. 10, the stripe region may extend in the direction. In this case, the primary cleavage surface is the {10-11} plane while the secondary cleavage surface is the {1-100} plane.

According to the semiconductor laser device of the third embodiment, where the main surface is tilted from the {0001} plane by 13° or more, no composition separation occurs in the active layer.

In the first to third embodiments, the substrate made of gallium nitride was used. Alternatively, a substrate made of aluminum gallium indium nitride may be used. In this case, also, substantially the same effect as that described above is obtained.

It should be understood that in the case of using a substrate made of aluminum gallium indium nitride or in the case of having strain in the substrate, the tilt angle θ may more or less vary from a predetermined angle due to a shift of the lattice constant.

In the first to third embodiments, semiconductor laser devices were exemplified. The nitride semiconductor device of the present invention may also be a device having any of other function regions such as a transistor. In this case, also, it is naturally possible to obtain the effects that separation into chips by cleavage is facilitated and that composition separation can be suppressed and thus the operating current can be reduced.

What is claimed is:

1. A nitride semiconductor device comprising:
   a substrate made of a III–V group compound semiconductor containing nitride and having a main surface and primary and secondary cleavage surfaces; and
   a function region made of a III–V group compound semiconductor layer containing nitride formed on the main surface of the substrate and extending in the direction;
   wherein the main surface of the substrate is a surface tilted from a {0001} plane by tilt angle θ in a range of 13° to 90°, and
   wherein when the tilt angle θ is in the range of 45°≦90° the primary cleavage surface is along a {11-20} plane and the secondary cleavage surface is along the {0001} plane, and when the tilt angle θ is in the range of 13°≦45° the primary cleavage surface is along a {11-20} plane and the secondary cleavage surface is along the {1-101} plane.

2. The nitride semiconductor device of claim 1, wherein the main surface of the substrate is perpendicular to the {11-20} plane.

3. The nitride semiconductor device of claim 1, wherein the function region is an active layer that emits light, and the {11-20} plane of the substrate is an optical resonator plane.

4. The nitride semiconductor device of claim 1, wherein the main surface of the substrate is a {1-100} plane.

5. The nitride semiconductor device of claim 4, wherein the function region is an active layer that emits light, and the {11-20} plane of the substrate is an optical resonator plane.

6. A nitride semiconductor device comprising:
   a substrate made of a III–V group compound semiconductor containing nitride and having a main surface and primary and secondary cleavage surfaces; and
   a function region made of a III–V group compound semiconductor layer containing nitride formed on the main surface of the substrate and extending in a direction;
   wherein the main surface of the substrate is a surface tilted from a {1-101} plane by tilt angle θ of 28.1° and the primary cleavage surface is along the {1-101} plane and the secondary cleavage surface is along an {11-20} plane.

7. The nitride semiconductor device of claim 6, wherein the main surface of the substrate is perpendicular to the {11-20} plane.

8. The nitride semiconductor device of claim 6, wherein the function region is an active layer that emits light, and the {1-101} plane of the substrate is an optical resonator plane.

* * * * *

UNITED STATES PATENT AND TRADEMARK OFFICE
CERTIFICATE OF CORRECTION

PATENT NO. : 6,653,663 B2  
DATED : November 25, 2003  
INVENTOR(S) : Masahiro Ishida It is certified that error appears in the above-identified patent and that said Letters Patent is hereby corrected as shown below:

Title page,
Item [75], Inventors, "Ishida" residence is listed as "Hirakata", this should read
-- Osaka --

Signed and Sealed this

Twenty-sixth Day of April, 2005

JON W. DUDAS  
*Director of the United States Patent and Trademark Office*

UNITED STATES PATENT AND TRADEMARK OFFICE
CERTIFICATE OF CORRECTION

PATENT NO. : 6,653,663 B2  
DATED : November 25, 2003  
INVENTOR(S) : Masahiro Ishida It is certified that error appears in the above-identified patent and that said Letters Patent is hereby corrected as shown below:

<u>Column 12,</u>  
Lines 16-17, "$\Theta$ in a range of 13° to 90°" should read -- $\Theta$ in a range of $13° \leq \Theta \leq 90°$ --.

Signed and Sealed this

Eighteenth Day of October, 2005

JON W. DUDAS  
*Director of the United States Patent and Trademark Office*